United States Patent
Yi et al.

(10) Patent No.: US 8,062,395 B2
(45) Date of Patent: Nov. 22, 2011

(54) ADJUVANT FOR CMP SLURRY

(75) Inventors: Gi Ra Yi, Seo-gu (KR); Jong Pil Kim, Yuseong-gu (KR); Young Jun Hong, Yuseong-gu (KR)

(73) Assignee: LG Chem, Ltd., Seoul (KR)

( * ) Notice: Subject to any disclaimer, the term of this patent is extended or adjusted under 35 U.S.C. 154(b) by 666 days.

(21) Appl. No.: 11/783,742

(22) Filed: Apr. 11, 2007

(65) Prior Publication Data
US 2007/0243710 A1 Oct. 18, 2007

(30) Foreign Application Priority Data

Apr. 14, 2006 (KR) ........................ 10-2006-0034079

(51) Int. Cl.
*B24D 3/02* (2006.01)
*C09C 1/68* (2006.01)
*C09K 3/14* (2006.01)

(52) U.S. Cl. .............................. 51/307; 51/308; 51/309
(58) Field of Classification Search .................. None
See application file for complete search history.

(56) References Cited

U.S. PATENT DOCUMENTS

| | | |
|---|---|---|
| 6,303,049 B1 | 10/2001 | Lee et al. |
| 6,561,876 B1 | 5/2003 | Tateyama et al. |
| 6,576,554 B2 | 6/2003 | Matsui et al. |
| 6,866,793 B2 | 3/2005 | Singh |
| 7,427,361 B2 * | 9/2008 | Small et al. ................... 252/79.1 |
| 2004/0186206 A1 * | 9/2004 | Yoneda et al. .................. 524/95 |
| 2005/0076581 A1 | 4/2005 | Small et al. |
| 2006/0118760 A1 | 6/2006 | Yang et al. |
| 2006/0141741 A1 | 6/2006 | Yi et al. |
| 2006/0148667 A1 * | 7/2006 | Fukasawa et al. ............. 510/178 |
| 2007/0132058 A1 | 6/2007 | Yi et al. |

FOREIGN PATENT DOCUMENTS

| | | |
|---|---|---|
| EP | 1160300 | 12/2001 |
| JP | 2000-160136 | 6/2000 |
| JP | 3523126 | 2/2004 |
| JP | 2004-363191 | 12/2004 |
| JP | 2008-521242 | 6/2008 |
| JP | 2009-518851 | 5/2009 |
| KR | 10-2000-0044860 A | 7/2000 |
| KR | 10-2004-0060138 A | 7/2004 |
| KR | 10-2005-0074834 A | 7/2005 |

* cited by examiner

*Primary Examiner* — Duy Deo
(74) *Attorney, Agent, or Firm* — McKenna Long & Aldridge LLP

(57) ABSTRACT

Disclosed is an adjuvant in use for a process of polishing a cationically charged material and an anionically charged material at the same time with abrasive particles, which is absorbed onto the cationically charged material thereby to restrain the cationically charged material from being polished, resulting in raising a polishing selectivity of the anionically charged material, wherein the adjuvant comprises polymer particles having a core-shell structure with a nano-scale particle size smaller than that of the abrasive particles, surfaces of which are anionically charged. CMP (chemical mechanical polishing) slurry comprising the above adjuvant and abrasive particles is also disclosed.

16 Claims, 1 Drawing Sheet

ADJUVANT FOR CMP SLURRY

This application claims the benefit of the filing date of Korean Patent Application No. 2006-34079, filed on Apr. 14, 2006, in the Korean Intellectual Property Office, the disclosure of which is incorporated herein in its entirety by reference.

TECHNICAL FIELD

The present invention relates to an adjuvant for Chemical Mechanical Polishing (CMP) slurry in use for a process of polishing a cationically charged material and an anionically charged material at the same time, which is adsorbed onto the cationically charged material, thereby enhancing the polishing selectivity of the adsorbed structure.

BACKGROUND ART

As microelectronic devices have been continuously provided with a larger integration scale, planarization processes used for manufacturing such microelectronic devices have become more and more important. As a part of efforts to obtain very large scale integrated microelectronic devices, multiple interconnection techniques and multilayer stacking techniques have generally been used for semiconductor wafers. However, non-polarization occurring after carrying out one of the above techniques causes may problems. Therefore, planarization processes are applied to various steps in a microelectronic device manufacturing process, so as to minimize irregularity on wafer surfaces.

One of these planarization techniques is Chemical Mechanical Polishing (CMP). During the process of CMP, a wafer surface is pressed against a polishing pad that rotates relative to the surface, and a chemical reagent known as CMP slurry is introduced into the polishing pad during the polishing process. Such a CMP technique accomplishes planarization of a wafer surface by way of chemical and physical actions. In other words, the CMP technique accomplishes planarization of a wafer surface by pressing the wafer surface against the polishing pad that rotates relative to the surface, and by supplying a chemically active slurry to the wafer surface having a pattern at the same time.

One embodiment, to which CMP technique is applied, is Shallow Trench Isolation (STI). In the STI technique, relatively shallow trenches are formed, and such trenches are used in forming field regions for separating active regions from wafer surfaces.

As shown in FIG. 1, in the STI process, a pad silicon oxide ($SiO_2$) layer 101 and a silicon nitride (SiN) layer 102 are formed successively on a semiconductor wafer. Next, a photoresist pattern is formed on the SiN layer 102. Then, the SiN layer 102, the pad silicon oxide layer 101 and the semiconductor wafer 100 are partially etched by using the photoresist pattern as a mask, so that a plurality of trenches 103 is formed.

Further, in order to form field regions, an insulating silicon oxide layer 104 is deposited by way of Low Pressure Chemical Vapor Deposition (LPCVD), Plasma Enhanced Chemical Vapor Deposition (PECVD) or High Density Plasma Chemical Vapor Deposition (HDPCVD) technique, so that the trenches 103 are filled with the layer 104, and the surface of the SiN layer 102 is covered with the layer 104.

Subsequently, the insulating silicon oxide layer 104 is polished until the SiN layer 102 is exposed. Additionally, the SiN layer 102 placed between two adjacent active regions, as well as the pad silicon oxide layer 101 is removed by etching. Finally, a gate silicon oxide layer 105 is formed on the surface of the semiconductor wafer.

Herein, during the progress of the CMP process for removing the insulating silicon oxide layer 104, the insulating silicon oxide layer 104 and the SiN layer 102 show different removal rates due to their different chemical and physical properties.

The ratio of the removal rate of the insulating silicon oxide layer to that of the silicon nitride layer is referred to as the selectivity of CMP slurry.

As the selectivity of CMP slurry decreases, the amount of the SiN layer removed by the slurry increases. It is preferable that the SiN layer is not removed. In other words, preferably, the selectivity of the insulating silicon oxide layer to the SiN layer is limitless. However, conventional CMP slurry has a low polishing selectivity of the insulating silicon oxide layer to the SiN layer, which is about 4:1. Hence, the SiN layer is polished to a degree exceeding the acceptable range in a practical CMP process.

As a result, the SiN layer pattern may be removed non-uniformly depending on location in a wafer during a CMP process. Therefore, the SiN layer has a variable thickness over the whole wafer. Practically, this is a serious problem in the case of a semiconductor wafer that has a highly dense pattern simultaneously with a sparse pattern.

Due to the above-mentioned problem, a final structure having field regions has a level difference between active regions and field regions, resulting in reduction of the margin of subsequent steps for manufacturing a semiconductor device, and degradation of the quality of a transistor and a device. Briefly, conventional CMP processes are problematic in that a SiN layer pattern with a uniform thickness cannot be obtained, even after removing the oxide layer via a CMP process.

To solve the problem, many attempts have been made recently to develop a slurry composition that can control the removal rate of the insulating silicon oxide layer, which still has much room for improvement.

DISCLOSURE OF THE INVENTION

An object of the present invention is to provide an adjuvant used in simultaneous polishing of a cationically charged material and an anionically charged material while minimizing a cohesion of the abrasive particles, the adjuvant forming an adsorption layer on the cationically charged material, thereby to effectively restrain the cationically charged material from being polished, resulting in increasing the polishing selectivity of the anionically charged material. For this adjuvant, the present invention adopts polymer particles having a core-shell structure with a nano-scale particle size smaller than that of the abrasive particles, and preferably, an average particle size ranging from 10 nm to 100 nm, the surface of which is anionically charged.

According to an aspect of the present invention, there is provided an adjuvant in use for a process of polishing a cationically charged material and an anionically charged material at the same time with abrasive particles, which is absorbed onto the cationically charged material thereby to restrain the cationically charged material from being polished, resulting in raising a polishing selectivity of the anionically charged material, wherein the adjuvant comprises polymer particles having a core-shell structure with a nano-scale particle size smaller than that of the abrasive particles, surfaces of which are anionically charged.

According to another aspect of the present invention, there is provided a CMP slurry including the abrasive particles and the adjuvant as mentioned above, wherein the adjuvant is not bonded with the abrasive particles by electrostatic force.

According to still another aspect of the present invention, there is provided a STI process using the aforementioned CMP slurry.

According to yet another aspect of the present invention, there is provided a method of restraining a cationically charged material from be polished in a polishing process using abrasive particles by using polymer particles having a core-shell structure, the surfaces of which are anionically charged, wherein the polymer particles have a nano-scale particle size smaller than that of the abrasive particles and are not bonded with the abrasive particles by electrostatic force.

The present invention will now be described in more detail.

The present invention is characterized in that as an adjuvant for a polishing process are used polymer particles having a core-shell structure and a nano-scale particle size smaller than that of the abrasive particles, and preferably, an average particle size ranging from 10 nm to 100 nm, the surfaces of which are anionically charged, thereby to effectively restrain a cationically charged material from being polished while minimizing a cohesion of the abrasive particles and the like.

In general, the surface of a silicon nitride is cationically charged and that of a silicon oxide is anionically charged. Therefore, in order to increase the polishing selectivity of silicon oxide to silicon nitride, an anionically charged polymer is adsorbed onto the cationically charged silicon nitride via electrostatic force, so that the cationically charged silicon nitride is prevented from being polished, and thus the anionically charged silicon oxide becomes more amenable to polishing.

The polymer particles according to the present invention, the surfaces of which are anionically charged, do not cohere with each other, and when adsorbed onto a cationically charged substrate (e.g., a silicon nitride), can form an adsorption layer as thick as the particle size thereby affording an excellent protection against the abrasive particles. In this case, it is preferable that the polymer particles, the surfaces of which are anionically charged, have a surface potential up to −25 mV. At a surface potential of −25 mV, cohesion can be minimized owing to electrostatic repulsion, and adsorption onto the cationically charged substrate can still be acceptable.

When molecular weight or particle size of the polymer particle is great but surface potential is very low, the polymer particle causes abrasive particles to cohere together and adsorb onto not only a cationically charged material (e.g., a silicon nitride) but also an anionically charged material (e.g., a silicon oxide), thereby forming a protective layer against polishing. As a result, in both of the cationically charged material and the anionically charged material, polishing rate declines and polishing selectivity decreases.

The surface potential range of the polymer particle can be controlled by adjusting the usage of a monomer containing an anionically charged functional group, for example.

In this case, the polymer particles have an average particle size ranging preferably from 10 nm to 100 nm, and more preferably, from 10 nm to 50 nm. These values are produced as the diameter of a globe on the assumption that the particles are globes of the same surface area.

When the polymer particles, the surfaces of which are anionically charged, have a particle size less than 10 nm, the particle size is too small, and thus the polymer particles adsorb sparsely onto a structure of a cationically charged material or form a thin coat, thereby failing to properly protect the structure against polishing.

To provide secure protection against polishing, it is preferable that the polymer particles, the surfaces of which are anionically charged, have a larger particle size. However, since larger polymer particles may cause problems such as scratches in the process of polishing, the polymer particles may preferably have an average particle size of 100 nm or less, and more preferably, 50 nm or less.

In brief, the polymer particles which have an anionically charged surface and an average particle size ranging from 10 nm to 100 nm can be selectively adsorbed onto a structure of a cationically charged material forming a thick layer, and when selectively adsorbed onto the structure of a cationically charged material (e.g., a silicon oxide), protect the adsorbed structure against polishing as well as raise the polishing selectivity of a structure of an anionically charged material (e.g., a silicon nitride) to that of the structure of a cationically charged material.

The polymer particles having a core-shell structure, the surfaces of which are anionically charged, can be used together with basic materials to form salts for the purpose of pH setting. However, it may be more preferable not to use the basic material if possible. The polymer nano particles used in other forms rather than salts can also be embraced in the scope of the present invention.

In the meantime, the adjuvant of the present invention can raise not only the polishing selectivity of the aforementioned anionically charged material, but also the polishing selectivity of uncharged materials. Therefore, the uncharged materials can also be regarded as equivalents of the anionically charged material of the present invention.

The polymer nano particles having a core-shell structure according to the present invention have a shell 202, the surface of which is anionically charged, and a core 201, as shown in FIG. 2.

To avoid a bonding with abrasive particles used together in a process of polishing, the zeta potential of the polymer nano particles preferably has the same polarity as that of the abrasive particles.

Since the shell of the core-shell polymer of the present invention mainly performs electrostatic absorption, the shell preferably includes a large amount of anionically charged monomeric units for adsorption onto a cationically charged material. For example, anionically charged monomeric units may include a functional group such as a carboxyl acid group, a sulfonic acid group and a hydroxyl group.

Since polishing slurries generally use water as a dispersion medium, the polymer particles according to the present invention, the surfaces of which are anionically charged, are preferably solved in water. Thus, the polymer particles preferably include hydrophilic monomeric units in the shell, and preferably contains monomeric units originating from ethylene-based unsaturated monomers which include a highly hydrophilic group, such as a hydroxyl group, a carboxyl group and a sulfonic group.

In the polymer particles having a core-shell structure according to the present invention, the core is less important than the shell in terms of adsorption by electrostatic force. While the core is not necessarily anionically charged, it is not preferable that the core is cationically charged. The core mainly acts to make the adsorption layer be formed thick. It is preferable that the core is hydrophobic so that the polymer particles having a core-shell structure can be produced more easily.

The polymer particles having a core-shell structure of the present invention can be produced by procedures of: mixing a main monomer, a comonomer, an emulsifier, an initiator and optionally an ultrahydrophobe; homogenizing the mixture;

and finally polymerizing the mixture into spherical particles by miniemulsion polymerization.

The main monomer may include any of monomers which are typically used in emulsion polymerization, in particular, any chemicals having an unsaturated double bond whose polymerization is carried out by a monomer free radical. The comonomer acts to raise the degree of crosslinking, and is used to adjust the hardness of particles or to adjust anionicity or zeta potential on the surface of the particles. The comononer can be used solely or in combination of at least two types.

Examples of the main monomer may include, but are not limited to, (meta)acrylates, (meta)acrylonitriles, (meta) acrylic acids, (meta)acrylamides, styrenes, vinylidene chloride, halogenated vinyl derivatives, butadiene derivatives and so on.

Examples of the anionic hydrophilic monomer may include, but are not limited to, ethylene-based unsaturated monomers containing a carboxyl group, ethylene-based unsaturated monomers containing a sulfonic acid group and ethylene-based unsaturated monomers containing a hydroxyl group. Available examples of the ethylene-based unsaturated monomers containing a carboxyl group may include carboxyl acid monomers such as acrylic acids, metacrylic acids, itaconic acids, maleic acids. Available examples the ethylene-based unsaturated monomers containing a sulfonic acid group may include styrene sulfonic acids, naphthalene sulfonic acids and so on. The ethylene-based unsaturated monomers containing a hydroxyl group may preferably include hydroxy alkyl metacrylates whose alkyl group has a carbon number of 1 to 12, and may also include hydroxyethyl metacrylates, hydroxypropyl metacrylates, hydroxybutyl metacrylates and so on.

The ultrahydrophobe is a substance capable of creating an osmotic pressure. When the ultrahydrophobe is mixed with another hydrophobic material (e.g., an oil phase compound and an organic solvent) into a homogenized solution, which is then mixed into water where an emulsifier is solved, and in which the oil is dispersed in the water by a homogenizer, forming particles having a size of tens or hundreds of nanometers, the ultrahydrophobe exerts an osmotic pressure to block organic substances of the oil particles from migrating from smaller particles to larger particles by the Ostwald ripening principle.

Examples of the ultrahydrophobe may include, but are not limited to, hydrocarbons whose carbon number is 12 to 20, aliphatic alcohols whose carbon number is 12 to 20, acrylates of an alkyl group whose carbon number is 12 to 20, alkyl mercaptans whose carbon number is 12 to 20, organic substances, fluorinated alkanes, silicone oil compounds, natural oils, synthetic oils and so on, and mixtures of at least two thereof.

Preferably, the ultrahydrophobe is provided at 0.1 to 10 parts by weight with respect to the main monomer of 100 parts by weight.

The emulsifier may be exemplified by an anionic emulsifier used in a typical emulsion polymerization. In detail, the anionic emulsifier may be exemplified by sulfonates; carboxyl acid salts; succinates; sulfosuccinates; and metal salts thereof such as akylbenzenesulfonic acids, sodium akylbenzene sulfonates, alkyl sulfonic acids, sodium stearates, sodium dodesil sulfates, sodium dodesil sulfosuccinates and abietic acid salt.

The contents of the emulsifier may be 0.05 to 20 parts by weight with respect to 100 parts by weight of the main monomer.

The initiator may be preferably exemplified by an initiator generating free radical, in particular, such as a peroxidic compound, azoic compound, oxidation and redox system compound. More preferably, the initiator may be exemplified by an azoic compound initiator such as 2,2,-azobis-4-methoxy-2,4-dimethylvaleronitrile, 2,2-azobis-2,4-dimethyvaleronitrile, 2,2-azobis-isobutyronitrile, 2,2-azobis-2-methylbutyronitrile, 2,2-azobis-cyclohexane carbonitrile, or 2,2-azobis-cyanopentane. The content of the initiator may be 0.01 to 0.3 part by weight with respect to 100 parts by weight of the main monomer.

The content of the deionized water may preferably be 100 to 800 parts by weight with respect to 100 parts by weight of the main monomer.

The solution of the polymer particles of the present invention, the surfaces of which are anionically charged, has a pH ranging preferably 4.5 to 8.8, and more preferably, 6.0 to 7.5. However, pH under 4.5 or exceeding 8.8 may cause an adverse effect to polishing selectivity.

The polymer particles having a core-shell structure of the invention can be converted into a salt by using a base material in a water phase.

In a case where the adjuvant of the present invention is used for a CMP slurry, the base material may include ammonium hydroxide ($NH_4OH$) and base amine (e.g., tetramethyl ammonium hydroxide, tetraethyl ammonium hydroxide, tetrapropyl ammonium hydroxide or tetrabutly ammonium hydroxide), which can be used solely or in combination of at least two types.

According to another aspect, the present invention provides a CMP slurry which includes (a) an adjuvant, which in a process of polishing a cationically charged material and an anionically charged material at the same time with abrasive particles, is absorbed onto the cationically charged material, thereby to restrain the cationically charged material from being polished, resulting in raising a polishing selectivity of the anionically charged material, and comprises polymer particles having a core-shell structure with a nano-scale particle size smaller than that of the abrasive particles, and preferably, an average particle size ranging from 10 nm to 100 nm, surfaces of which are anionically charged; (b) the abrasive particles; and (c) water, in which the polymer particles and the abrasive particles are not bonded by electrostatic force.

The adjuvant is preferably included by 0.1 to 10 wt % in the CMP slurry. At a content under 0.1 wt % or exceeding 10 wt %, the adjuvant may disadvantageously make selectivity decline.

The abrasive particles are preferably included by 0.1 to 10 wt % in the CMP slurry. At a content under 0.1 wt %, the abrasive particles may disadvantageously afford an insufficient removing rate of an oxide layer. At a content exceeding 10 wt %, the abrasive particles may destabilize the slurry.

The abrasive particles may be exemplified by nano-scale ceramic particles of for example silica, zirconium oxide, titanium oxide and cerium oxide, and preferably, of cerium oxide.

It is preferable that the abrasive particles have an average particle size ranging from 50 nm to 500 nm.

The CMP slurry can be produced by using the adjuvant of the present invention solved in a solvent (e.g., water) and abrasive particles dispersed in a dispersive medium (e.g., water). In the CMP slurry, the adjuvant of the present invention may be as a salt where polymer particles having a core-shell structure are bonded with a base material.

The adjuvant solution of the present invention has a concentration preferably ranging from 3 wt % to 3.5 wt %. The dispersion of the abrasive particles has a concentration preferably ranging from 4 wt % to 6 wt %. Accordingly, the water forming the CMP slurry may come from the water contained in the adjuvant solution or the dispersion of the abrasive particles. The water is used in such an amount as to adjust the total weight of the slurry to 100 wt %. Preferably, water is used in an amount of 94 wt % to 99.8 wt %. If the amount is less than 94 wt %, the slurry is degraded in terms of stability. If the amount is greater than 99.8 wt %, the polishing rate is degraded.

Further, the present invention provides a Shallow Trench Isolation (STI) method using the CMP slurry.

When the CMP slurry according to the present invention is used, it is possible to remove the SiN layer uniformly over the whole range of a wafer during a CMP process, due to a high selectivity of the silicon oxide layer to the silicon nitride layer. Hence, it is possible to minimize variations in the thickness. As a result, there is little difference between the levels of the active regions and those of the field regions, while not adversely affecting the quality of the transistor and the microelectronic device. Additionally, CMP work can be performed by using the slurry composition having high polishing selectivity and a low degree of agglomeration of abrasive particles. Therefore, the present invention may be applied suitably to the manufacture of a semiconductor device requiring a micropattern, thereby forming a high-quality micropattern and improving the reliability and productivity.

According to a further aspect, the present invention provides a method of restraining a cationically charged material from be polished in a polishing process using abrasive particles, by using polymer particles having a core-shell structure, the surfaces of which are anionically charged, in which the polymer particles have a nano-scale particle size smaller than that of the abrasive particles, and preferably, an average particle size ranging from 10 nm to 100 nm and are not bonded with the abrasive particles by electrostatic force.

In addition, the present invention may embrace, as an equivalent, a method of restraining an anionically charged material from being polished by using polymer particles having a core-shell structure, the surfaces of which are cationically charged. The polymer particles have a nano-scale particle size smaller than that of abrasive particles.

MODE FOR CARRYING OUT THE INVENTION

Figure 1:
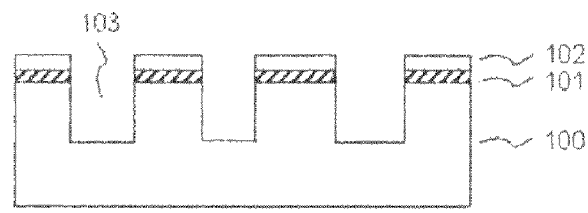
FIG. 1 is a flowchart illustrating a conventional STI process.
Figure 1:
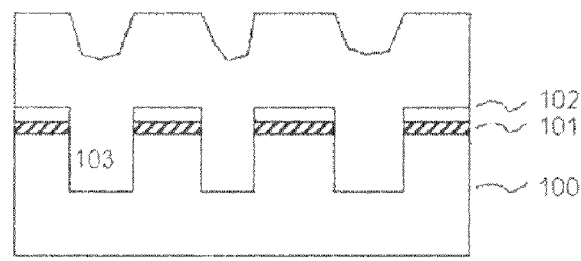
Figure 1:
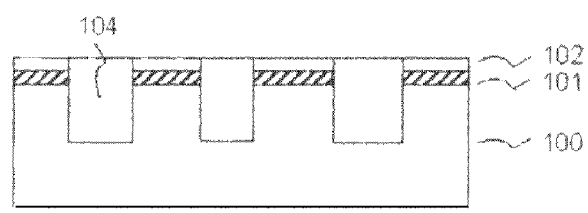
Figure 1:
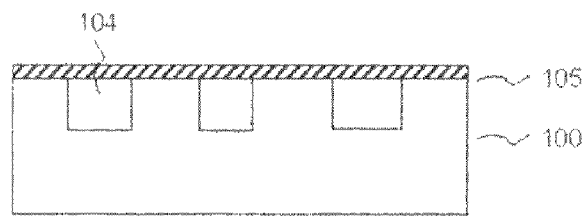
Figure 2:
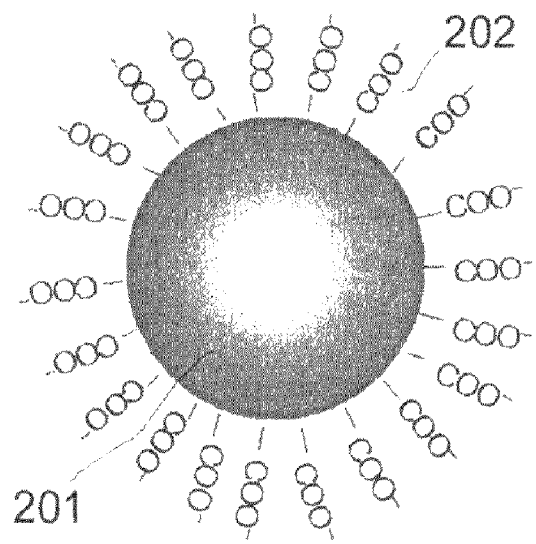
FIG. 2 is a schematic view illustrating the structure of a polymer nanoparticle, the surface of which is anionically charged according to an embodiment of the invention.

Reference will now be made in detail to the preferred embodiments of the present invention. It is to be understood that the following examples are illustrative only and the present invention is not limited thereto.

Example 1

(1) Preparing Core-Shell Structure Polymer Particles 100 parts by weight of styrene as hydrophobic monomer, 5 parts by weight of acrylic acid as anionically charged hydrophile monomer, 0.05 part by weight of V65 initiator (2,2'-azobis (2,4-dimethylvaleronitrile)) and 4.0 part by weight of hexadecan as an ultrahydrophobe were mixed together. Then, the mixture was inputted into a solution obtained by dissolving 10 parts by weight of sodium lauryl sulfate into 300 parts by weight of deionized water. By using an ultrasonic aspirator, the mixed solution was treated for 5 minutes into a miniemulsion. Then, the miniemulsion was heated at a temperature ranging from 60° C. to 90° C. for 5 hours while being stirred slowly in a batch reactor (SBR) to cause polymerization.

Resultant polymer particles were centrifuged at 17,000 RPM for 2 hours by using a centrifugal machine (MEGA17R available from Hanil Science Industrial, Korea), and a sediment was re-dispersed into water. The aforementioned centrifugation and re-dispersion were repeated three times to remove the emulsifier, thereby producing a solution of polymer particles having a core-shell structure. The resultant polymer particles had an average particle size of 50 nm.

(2) Producing High Selectivity Adjuvant for CMP Slurry

The polymer particle solution was diluted with water to be 3 wt %, and ammonium hydroxide was added to the resultant solution to set pH to be 7.1, thereby producing a final adjuvant for CMP slurry.

(3) Producing CMP Slurry

A CMP slurry was produced by mixing 5 wt % of cerium oxide slurry composition (HS8005HX, available from Hitachi Chemical) as an abrasive particle composition, the adjuvant for CMP slurry produced as above and water according a volume ratio of 1:3:3. The abrasive particles used had an average particle size of about 250 nm.

Comparative Example 1

A CMP slurry was produced by mixing 5 wt % of cerium oxide slurry composition (HS8005HX, available from Hitachi Chemical) as an abrasive particle composition and water according to a volume ratio of 1:6.

Comparative Example 2

Preparing Adjuvant for CMP Slurry

An adjuvant for a CMP slurry was prepared according to the same process as in Example 1 above except that HS8102GP (available from Hitachi Chemical) based on a linear anionic polymer was substituted for the solution of core-shell structure polymer particles as prepared in Example 1 above.

Preparing CMP Slurry

A CMP slurry was produced by mixing 5 wt % of cerium oxide slurry composition (HS8005HX, available from Hitachi Chemical) as an abrasive particle composition, the adjuvant for CMP slurry produced as above and water according a volume ratio of 1:3:3.

Experiment

A following process was performed to measure pH, ion conductivity (mS), average cohesion particle size (nm), oxide layer polishing rate (Å/min), nitride layer polishing rate (Å/min) and selectivity from the CMP slurries produced from Example 1 and Comparative Examples 1 and 2 above, and the results are reported in Table 1 below.

a) pH: A pH meter (Corning pH Meter 445) was used to measure pHs.

b) Average cohesion particle size: A dynamic light scattering device (Microtrap UPA150 available from Honeywell, USA) was used to measure average cohesion particle sizes.

c) Oxide layer polishing rate: Polishing was performed by a polishing machine POLI400 available from GNP Technology, and initial and post-polishing thicknesses were measured from oxide layers having a nanometric thickness by a Nanospec 6100.

d) Nitride layer polishing rate: Polishing was performed by a polishing machine POLI400 available from GNP Technology, and initial and post-polishing thicknesses were measured from nitride layers having a nanometric thickness by a Nanospec 6100.

e) Selectivity: Selectivities were produced by dividing the polishing rate of oxide layers with the polishing rate of nitride layers.

f) Thickness deviation: Thickness deviations were produced by dividing the standard deviation of the polishing rate of oxide layers with average polishing rate.

TABLE 1

| | Adjuvant | pH | CPS* | OLPR* (Å/min) | TD* | NLPR* (Å/min) | Selectivity |
|---|---|---|---|---|---|---|---|
| Exam. 1 | 051011-2 | 8 | 412 | 1724 | 6.20 | 51 | 34 |
| Comp. Exam. 1 | W/O | | 307 | 5849 | 6.63 | 957 | 6 |
| Comp. Exam. 2 | GP3 | | 2570 | 4799 | 6.4 | 72 | 67 |

Note)
CPS*: Cohesion particle size
OLPR*: Oxide layer polishing rate
TD*: Thickness deviation
NLPR*: Nitride layer polishing rate Cohesion in slurry refers to a phenomenon in which at least two abrasive particles cohere together when an adjuvant adsorbs onto the abrasive particles. The polymer particles having a core-shell structure as in Example 1 above move more slowly than linear acrylic acid molecules as in Comparative Example 2. Accordingly, we expect that the polymer particles of Example 1 used as the adjuvant need a longer time for adsorption onto the abrasive particles, thereby decreasing the adsorption amount.

While the polymer particles having a core-shell structure also show inferior adsorption ability onto a substrate to be polished on the same reason, the polymer particles are more likely to adsorb onto a stationary substrate than onto moving abrasive particles. Furthermore, the polymer particles, once adsorbed can afford more excellent protection, thereby realizing desired selectivity ratio.

INDUSTRIAL APPLICABILITY

As set forth above, the present invention provides polymer particles having a core-shell structure, the surfaces of which are anionically charged and the average particle size of which ranges from 10 nm to 100 nm. When the polymer particles of the present invention are used in a process of polishing a cationically charged material and an anionically charged material at the same time, the polymer particles can adsorb onto the cationically charged material, thereby raising the polishing selectivity of the anionically charged material to the cationically charged material along with the minimized cohesion of the particles.

Although the detailed embodiments of the present invention have been described for illustrative purposes, those skilled in the art will appreciate that various modifications, additions and substitutions are possible, without departing from the scope and spirit of the invention as disclosed in the accompanying claims.

The invention claimed is:

1. An adjuvant for protecting silicon nitride layer in use for a process of polishing a cationically charged material and an anionically charged material at the same time with abrasive particles,
    wherein the adjuvant is absorbed onto the cationically charged material thereby to restrain the cationically charged material from being polished, resulting in raising a polishing selectivity of the anionically charged material,
    wherein the adjuvant comprises polymer particles having a core-shell structure with a nano-scale particle size smaller than that of the abrasive particles, surfaces of which are anionically charged,
    wherein the adjuvant has a pH ranging from 4.5 to 8.8, and
    wherein the polymer particles have a surface potential ranging up to −25 mV.

2. The adjuvant according to claim 1, wherein polymer particles are not bonded by electrostatic force with the abrasive particles to be used together in the polishing process.

3. The adjuvant according to claim 2, wherein the polymer particles have a zeta potential, polarity of which is equal to that of the abrasive particles.

4. The adjuvant according to claim 1, wherein the polymer particles have an average size ranging from 10 nm to 100 nm.

5. The adjuvant according to claim 1, which is used for Chemical Mechanical Polishing (CMP) slurry.

6. The adjuvant according to claim 1, wherein the polymer particles of the core-shell structure have a hydrophobic core and a hydrophilic shell.

7. The adjuvant according to claim 1, wherein the polymer particles are spherical.

8. The adjuvant according to claim 1, wherein the polymer particles have the anionically charged surfaces by at least one selected from the group consisting of a carboxyl acid group (—COOH), a sulfonic acid group and a hydroxyl group (—OH).

9. The adjuvant according to claim 1, wherein the polymer particles are produced by a process of miniemulsion polymerization.

10. The adjuvant according to claim 1, wherein the polymer particles having the anionically charged surface react with basic materials to form salts.

11. A Chemical Mechanical Polishing (CMP) slurry comprising:
    a) an adjuvant as defined in claim 1;
    b) abrasive particles; and
    c) water,
    wherein the adjuvant is not bonded with the abrasive particles by electrostatic force.

12. The CMP slurry according to claim 11, comprising 0.1 wt % to 10 wt % of the adjuvant; 0.1 wt % to 10 wt % of the abrasive particles; and 94 wt % to 99.8 wt % of water based on 100 wt % of the total weight of the slurry.

13. The CMP slurry according to claim 11, wherein the abrasive particles have an average particle size ranging from 50 nm to 500 nm.

14. The CMP slurry according to claim 11, wherein the abrasive particles are made of at least one selected from the group consisting of silica, zirconium oxide, titanium oxide and cerium oxide.

15. The CMP slurry according to claim 11, which is used for a process of Shallow Trench Isolation (STI).

16. A method of restraining a cationically charged material from being polished in a polishing process using an adjuvant and abrasive particles comprising:
  preparing polymer particles having a core-shell structure, surfaces of which are anionically charged, wherein the polymer particles have a nano-scale particle size smaller than that of the abrasive particles and are not bonded with the abrasive particles by electrostatic force,
  wherein the adjuvant is absorbed onto the cationically charged material to thereby restrain the cationically charged material from being polished, resulting in raising a polishing selectivity of the anionically charged material,
  wherein the adjuvant comprises the polymer particles,
  wherein the adjuvant has a pH ranging from 4.5 to 8.8, and
  wherein the polymer particles have a surface potential ranging up to −25 mV.

* * * * *